United States Patent
Horiuchi et al.

(10) Patent No.: US 11,089,696 B2
(45) Date of Patent: Aug. 10, 2021

(54) PORTABLE INFORMATION DEVICE

(71) Applicant: LENOVO (SINGAPORE) PTE. LTD., Singapore (SG)

(72) Inventors: Shigehiro Horiuchi, Yokohama (JP); Takehito Yamauchi, Yokohama (JP); Kenji Watamura, Yokohama (JP); Fumitake Mizoguchi, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 35 days.

(21) Appl. No.: 16/749,548

(22) Filed: Jan. 22, 2020

(65) Prior Publication Data
US 2021/0068272 A1 Mar. 4, 2021

(30) Foreign Application Priority Data
Aug. 27, 2019 (JP) .............................. JP2019-154928

(51) Int. Cl.
*H05K 5/00* (2006.01)
*H05K 5/02* (2006.01)

(52) U.S. Cl.
CPC ......... *H05K 5/0017* (2013.01); *H05K 5/0226* (2013.01)

(58) Field of Classification Search
None
See application file for complete search history.

(56) References Cited

U.S. PATENT DOCUMENTS

| | | | | |
|---|---|---|---|---|
| 9,348,450 B1* | 5/2016 | Kim | ..................... | G06F 1/1681 |
| 9,733,668 B2* | 8/2017 | Park | ..................... | G06F 1/1679 |
| 9,801,290 B2* | 10/2017 | Ahn | ..................... | G06F 1/1652 |
| 10,063,677 B2* | 8/2018 | Cavallaro | ............. | G06F 1/1626 |
| 10,117,346 B2* | 10/2018 | Yang | ..................... | H05K 5/0086 |
| 10,143,098 B1* | 11/2018 | Lee | ..................... | H05K 5/0017 |
| 10,440,817 B2* | 10/2019 | Choi | ..................... | G06F 1/1641 |
| 2011/0043976 A1* | 2/2011 | Visser | ..................... | G09F 9/301 |
| | | | | 361/679.01 |

(Continued)

FOREIGN PATENT DOCUMENTS

| | | |
|---|---|---|
| JP | 2013175549 A | 9/2013 |
| JP | 2018112833 A | 7/2018 |

(Continued)

*Primary Examiner* — Anthony Q Edwards
*Assistant Examiner* — Rashen E Morrison
(74) *Attorney, Agent, or Firm* — Shimokaji IP

(57) ABSTRACT

The portable information device includes: a first chassis member; a second chassis member relatively turnably (i.e., foldably) connected to the first chassis member; a first support plate fastened to the first chassis member; a second support plate that is fastened to the second chassis member and provided adjacent to the first support plate; a display whose back surface is supported by respective front surfaces of the first and second support plates; and an adhesive member that adheres to the front surfaces of the first and second support plates and the back surface of the display and fastens them together. Furthermore, an area that overlaps with at least a folding area includes a weak adhesive section in which an adhesive force of the adhesive member between the first and second support plates and the display is reduced to be lower than the other section.

11 Claims, 12 Drawing Sheets

(56) References Cited

U.S. PATENT DOCUMENTS

| | | | |
|---|---|---|---|
| 2011/0063783 A1* | 3/2011 | Shim | G06F 1/1681 361/679.01 |
| 2012/0120618 A1* | 5/2012 | Bohn | G06F 1/1681 361/749 |
| 2015/0089974 A1* | 4/2015 | Seo | A44C 5/0076 63/1.13 |
| 2017/0060188 A1* | 3/2017 | Han | G06F 1/1681 |
| 2017/0061836 A1* | 3/2017 | Kim | G06F 1/1652 |
| 2017/0196078 A1 | 7/2017 | Choi et al. | |

FOREIGN PATENT DOCUMENTS

| | | | |
|---|---|---|---|
| JP | 2019067279 A | 4/2019 | |
| JP | 2020046541 A | 3/2020 | |

\* cited by examiner

PORTABLE INFORMATION DEVICE

FIELD OF THE INVENTION

The present invention relates to a portable information device with turnable chassis.

BACKGROUND OF THE INVENTION

In recent years, portable information devices such as a tablet PC and a smartphone that include a touch-panel liquid crystal display but no physical keyboard have rapidly been in widespread use. While this type of portable information device desirably has a large display when in use, a small display is desirable when not in use. Accordingly, there has been proposed a portable information device that uses a flexible display, such as an organic electroluminescence (EL) display, thereby enabling not only a chassis but also the display to be folded (see, for example, Japanese Unexamined Patent Application Publication No. 2018-112833).

SUMMARY OF THE INVENTION

In a configuration according to Japanese Unexamined Patent Application Publication No. 2018-112833, a sheet-like member, such as metal foil, is bonded to a top surface of a pair of right and left support plates, and the display is supported by the surface. At this time, a non-adhesive area is provided between the sheet-like member and the support plates and in a portion corresponding to a folding portion of the support plates, and this allows the folding motion of the support plates.

Incidentally, such adhering of the support plates and the sheet-like member is generally made with double-sided tape. Then, the portion corresponding to the folding portion is not provided with double-sided tape, and thereby the non-adhesive area is formed. This change in a structure is projected onto the display having a very thin structure, and something like a line or a streak may appear on the surface of the display. This is likely to cause reduction in the quality of external appearance and the visibility.

The present invention has been made in view of the above-described problems of the conventional technology, and is intended to provide a portable information device that makes it possible to improve the quality of external appearance and the visibility of a display.

A portable information device according to a first aspect of the present invention is a portable information device that includes: a first chassis member; a second chassis member relatively turnably (i.e, foldably) connected to the first chassis member; a first support plate fastened to the first chassis member; a second support plate that is fastened to the second chassis member and provided adjacent to the first support plate; a display that a back surface thereof is supported by respective front surfaces of the first and second support plates, the display including a folding area that is folded when the first chassis member and the second chassis member turn relatively; and an adhesive member that adheres to the front surfaces of the first and second support plates and the back surface of the display, and fastens the first and second support plates and the display together, in which an area that overlaps with at least the folding area includes a weak adhesive section in which an adhesive force of the adhesive member between the front surfaces of the first and second support plates and the back surface of the display is reduced to be lower than the other section.

According to such a configuration, when the chassis members are turned, the weak adhesive section fastens the folding area of the display in an open state to the support plates. Then, when the chassis members are folded from the open state to a closed state, the weak adhesive section easily detaches itself from the back surface of the display or the front surfaces of the support plates, and thus does not interfere with the folding motion of the display. Accordingly, although the portable information device includes the foldable display, it is possible to suppress the occurrence of creases or uplift in the display including the folding area and its surrounding area when in use and therefore improve the quality of external appearance and the visibility of the display.

The adhesive force in the weak adhesive section may be reduced by providing a portion of the adhesive member with a non-adhesive portion with no adhesive applied thereto.

The adhesive force in the weak adhesive section may be reduced by providing an adhesive surface of a portion of the adhesive member with a non-adhesive portion covered with a masking material to remove an adhesive force of the non-adhesive portion.

The adhesive force in the weak adhesive section may be reduced by applying an adhesive having lower adhesiveness than the other section to a portion of the adhesive member.

In the weak adhesive section, an adhesive force relative to the adhesive member may be reduced by causing a portion of, of the front surfaces of the first and second support plates and the back surface of the display, at least either one to be subjected to surface treatment.

In the weak adhesive section, the adhesive force of the adhesive member on, of the back surface of the display and the front surfaces of the first and second support plates, one surface may be relatively lower than the adhesive force of the adhesive member on the other surface. Then, it can be configured that the weak adhesive section detaches itself selectively from the display or the support plates. Thus, it is possible to easily select the display or the support plates from which the weak adhesive section detaches itself at the time of turning motion.

It may be configured that: when the first chassis member and the second chassis member are set in an operable form in which they are disposed on substantially the same plane, the weak adhesive section adheres to the one surface and the other surface; and when the first chassis member and the second chassis member are turned to a position in which they face each other and are set in a storage form in which the folding area is folded, the weak adhesive section detaches itself from the one surface and adheres to the other surface.

It may be configured that: the one surface is the back surface of the display; the other surface is the front surfaces of the first and second support plates; and the weak adhesive section includes a first area adhering to the side of the first support plate and a second area adhering to the side of the second support plate with reference to a boundary between the first support plate and the second support plate.

It may be configured that: the one surface is the front surfaces of the first and second support plates; the other surface is the back surface of the display; and the weak adhesive section includes a first area adhering the side of the first support plate to the side of the second support plate and a second area adhering the side of the second support plate to the side of the first support plate with reference to a boundary between the first support plate and the second support plate.

It may be configured that: the weak adhesive section includes a first area adhering to the side of the first support plate and a second area adhering to the side of the second support plate with reference to a boundary between the first support plate and the second support plate; the first area has a wavy shape extending along the boundary; the second area has a wavy shape that extends along the boundary and faces the wavy shape of the first area through a gap; and the gap serves as the non-adhesive portion.

It may be configured that: the weak adhesive section includes a first area adhering to the side of the first support plate and a second area adhering to the side of the second support plate with reference to a boundary between the first support plate and the second support plate; the first area and the second area each have a plurality of holes with no adhesive applied thereto; and the holes serve as the non-adhesive portion.

In the weak adhesive section, the adhesive force on both ends of the folding area in a longitudinal direction may be higher than the adhesive force on a middle part in the longitudinal direction.

The above-described aspect of the present invention can improve the quality of external appearance and the visibility of the display.

DETAILED DESCRIPTION OF THE INVENTION

Preferred embodiments of a portable information device according to the present invention will be described in detail below with reference to accompanying drawings.

Figure 1:
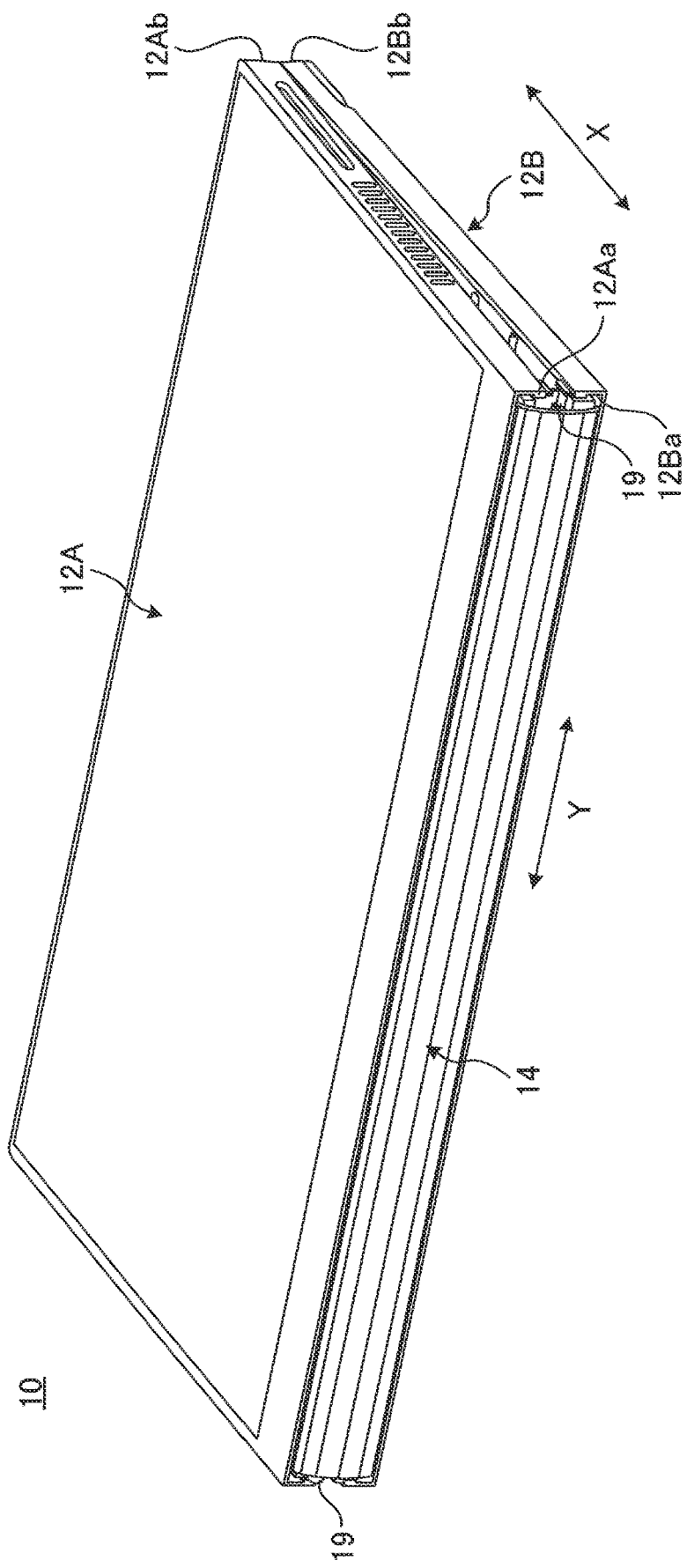
FIG. 1 is a perspective view showing a state where a portable information device according to an embodiment is closed and in a storage form.
Figure 2:
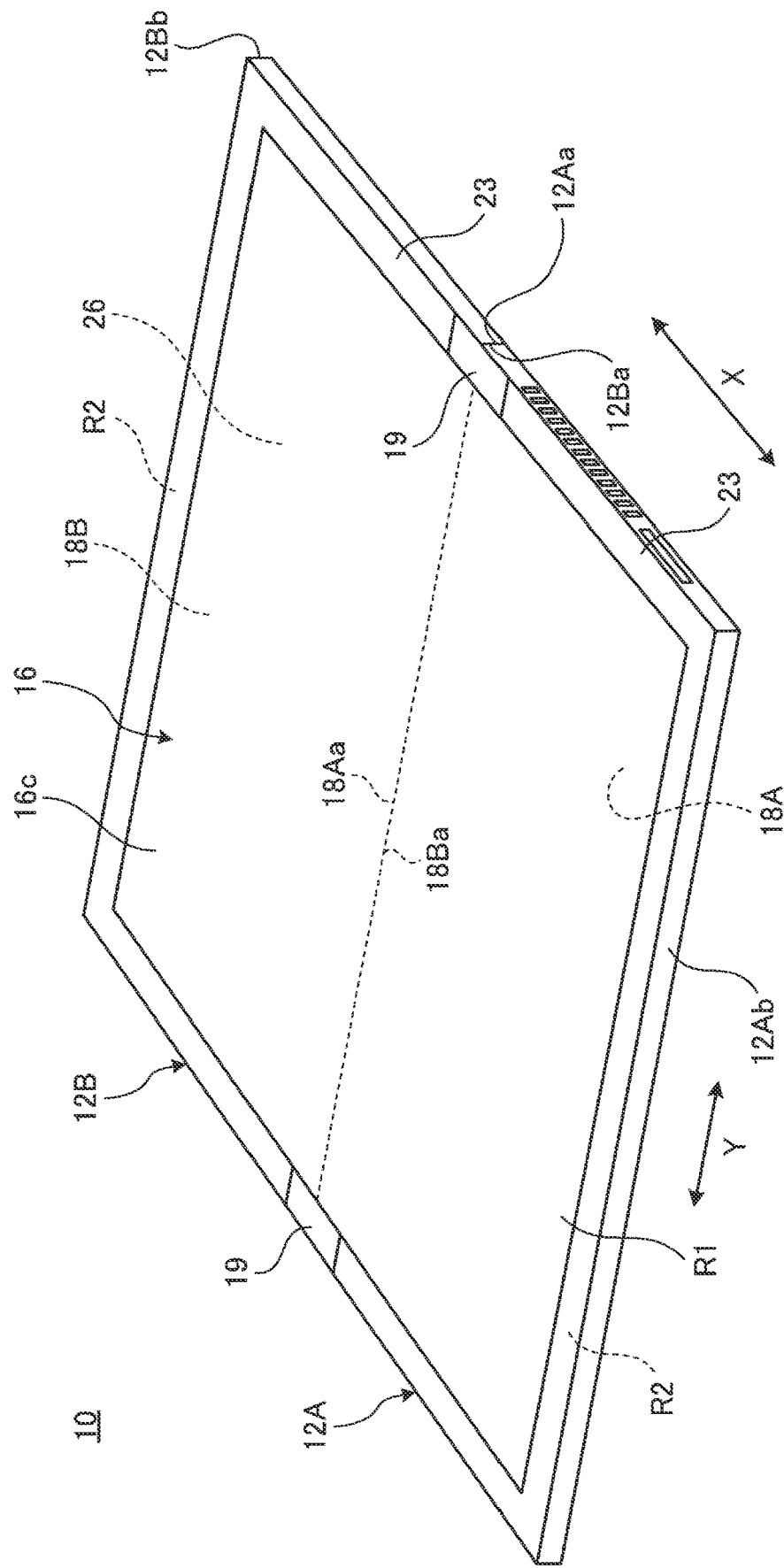
FIG. 2 is a perspective view schematically showing a state where the portable information device shown in FIG. 1 is opened and in an operable form.
Figure 3:
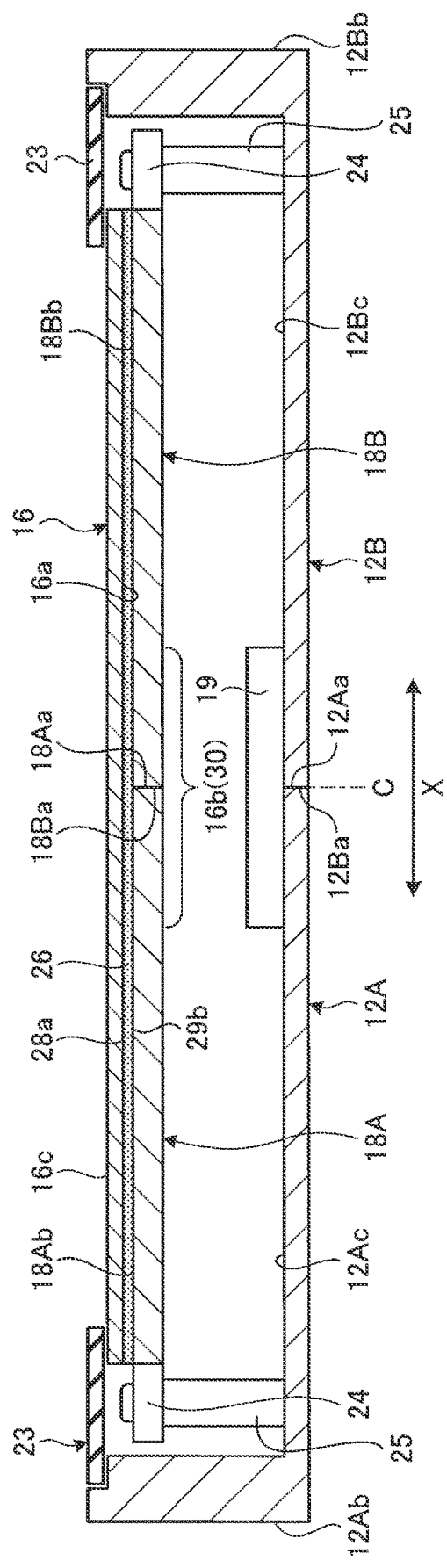
FIG. 3 is a cross-sectional side view schematically showing an internal structure of the portable information device shown in FIG. 2.

FIG. 1 is a perspective view showing a state where a portable information device 10 according to an embodiment is closed and in a storage form. FIG. 2 is a perspective view schematically showing a state where the portable information device 10 shown in FIG. 1 is opened and in an operable form. FIG. 3 is a cross-sectional side view schematically showing an internal structure of the portable information device 10 shown in FIG. 2.

As shown in FIGS. 1 and 2, the portable information device 10 includes first and second chassis members 12A and 12B, a spine member 14, and a display 16. The portable information device 10 in the present embodiment is a tablet PC that can be folded in two like a book. Examples of the portable information device 10 may include a cell-phone, a smartphone, an electronic notebook, a handheld game console, etc.

The chassis members 12A and 12B are each a rectangular plate-like member with side walls standing on its three sides other than a side corresponding to the spine member 14. The chassis members 12A and 12B include, for example, a plate of metal, such as stainless steel, magnesium, or aluminum, or a fiber-reinforced resin plate including reinforced fiber such as carbon fiber. The display 16 is provided so as to extend over respective inner surfaces 12Ac and 12Bc of the chassis members 12A and 12B. The display 16 is supported by the inner surfaces 12Ac and 12Bc through first and second support plates 18A and 18B.

The chassis members 12A and 12B are disposed adjacent to each other. The chassis members 12A and 12B are connected through a pair of hinge mechanisms 19 and 19 provided on both ends of first edges 12Aa and 12Ba that are adjacent edges of the chassis members 12A and 12B. The hinge mechanisms 19 connect between the chassis members 12A and 12B so that the chassis members 12A and 12B can be folded in the storage form shown in FIG. 1 and unfolded in the operable form shown in FIG. 2. In the operable form, the chassis members 12A and 12B are disposed on substantially the same plane. In the storage form, the chassis members 12A and 12B are folded to a position where they come face-to-face with each other. An alternate long and short dash line C shown in FIG. 3 indicates a folding center C that is the center of the folding motion of the chassis members 12A and 12B. The first edges 12Aa and 12Ba of the chassis members 12A and 12B on the side of the spine member 14 are a hinge-side end. Second edges 12Ab and 12Bb of the chassis members 12A and 12B on the opposite side to the side of the spine member 14 are an open end.

The hinge mechanisms 19 are disposed, for example, on both longitudinal (Y-direction) ends of the first edges 12Aa and 12Ba of the chassis members 12A and 12B, and are located outside of the outer periphery of the display 16. The portable information device 10 in the present embodiment has a configuration in which the turning center of the chassis members 12A and 12B through the hinge mechanisms 19 coincides with the middle of a front surface 16c of the display 16.

As for the portable information device 10, hereinafter, as shown in FIGS. 1 and 2, a direction from the spine member 14 located in the middle to the second edges 12Ab and 12Bb is referred to as an X direction, and a direction along a longitudinal direction of the spine member 14 is referred to as a Y direction.

The display 16 is a touch-panel flexible display. For example, the display 16 is a highly flexible organic EL display having a paper structure. The display 16 is opened/closed in accordance with the opening/closing motion of the chassis members 12A and 12B. A bezel member 23 is provided on the outer periphery of the front surface 16c of the display 16. The bezel member 23 covers a non-display area (an inactive area) R2 of the outer periphery of the front surface 16c of the display 16 other than a display area (an active area) R1. The display 16 is an assembly of parts stacked in layers, and includes, for example, a touch panel as a top layer, a display unit as an intermediate layer, a cover film as a bottom layer, etc.

For example, as shown in FIG. 3, the display 16 is positioned and fastened to the chassis members 12A and 12B through attachment pieces 24 provided so as to project from respective outer peripheral end surfaces of the support plates 18A and 18B. The plurality of attachment pieces 24 is provided at appropriate points on the outer peripheries of the support plates 18A and 18B other than adjacent first edges 18Aa and 18Ba. The attachment pieces 24 are screwed to, for example, bosses 25 provided on the inner surfaces 12Ac and 12Bc. Thus, the support plates 18A and 18B are attached to the inner surfaces 12Ac and 12Bc of the chassis members 12A and 12B, respectively.

In a chassis internal space between the chassis members 12A and 12B and the support plates 18A and 18B, various semiconductor chips, such as a circuit board and a CPU, and various components, such as a communication module, a battery device, and a cooling device, are installed and fixed.

The spine member 14 is formed of a flexible, thin plate-like member, and serves as a spine when the portable information device 10 is folded. The spine member 14 is provided to stretch between the chassis members 12A and 12B so as to cover a gap between the first edges 12Aa and 12Ba from the inside. As shown in FIG. 1, when the portable information device 10 is in the storage form, the first edges 12Aa and 12Ba of the chassis members 12A and 12B are largely separated from each other, and there is a gap between them. The spine member 14 covers this gap between the first edges 12Aa and 12Ba, thereby preventing exposure of the display 16 and various components inside.

Subsequently, a configuration example of the support plates 18A and 18B is described. As shown in FIG. 3, the support plates 18A and 18B are each a thin plate-like member. The support plates 18A and 18B are plates that support the display 16. A back surface 16a of the display 16 is fastened to front surfaces 18Ab and 18Bb of the support plates 18A and 18B with an adhesive member 26. The support plates 18A and 18B are supported by the chassis members 12A and 12B, respectively, and are opened and closed like a book centering on the folding center C.

The support plates 18A and 18B include, for example, a plate of metal, such as stainless steel, or a fiber-reinforced resin plate including carbon fiber or the like. In the operable form, the adjacent first edges 18Aa and 18Ba of the support plates 18A and 18B are in contact with each other (see FIG. 5A). In the storage form, the first edges 18Aa and 18Ba of the support plates 18A and 18B are separated from each other (see FIG. 5B).

Figure 4:
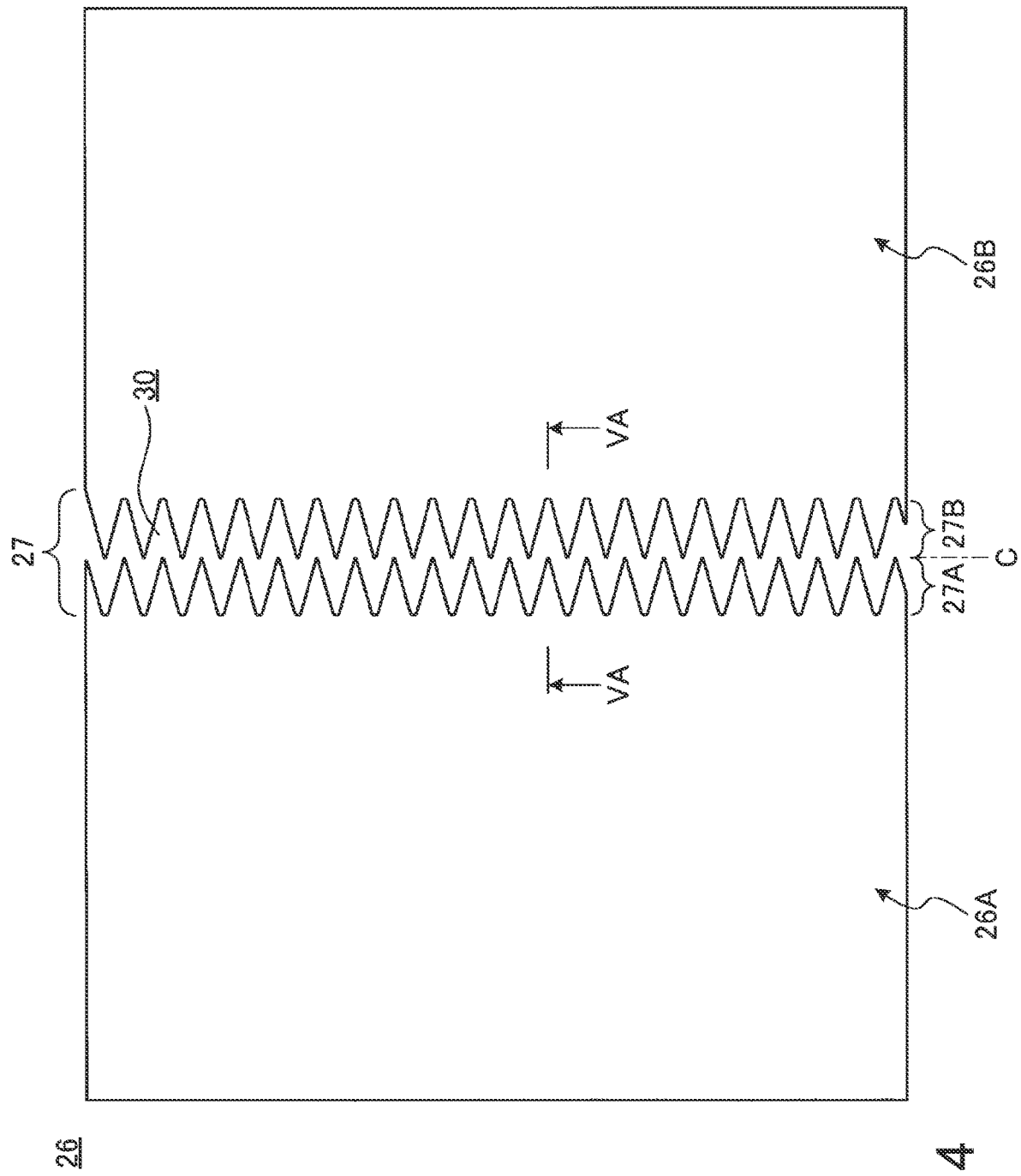
FIG. 4 is a plan view of an adhesive member.
Figure 5A:
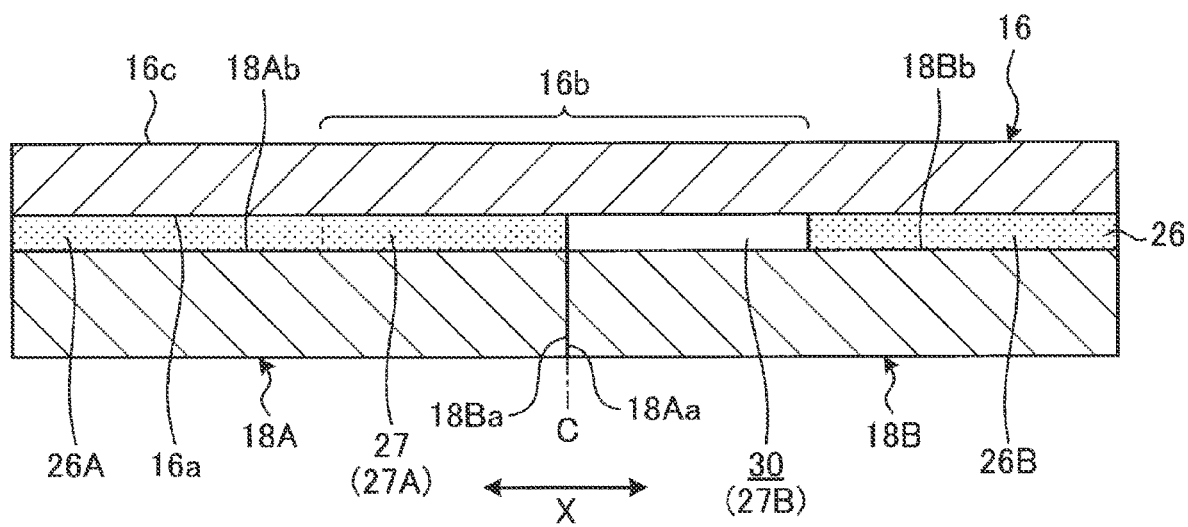
FIG. 5A is a cross-sectional side view schematically showing a configuration of a display, the adhesive member, and support plates in the operable form.
Figure 5B:
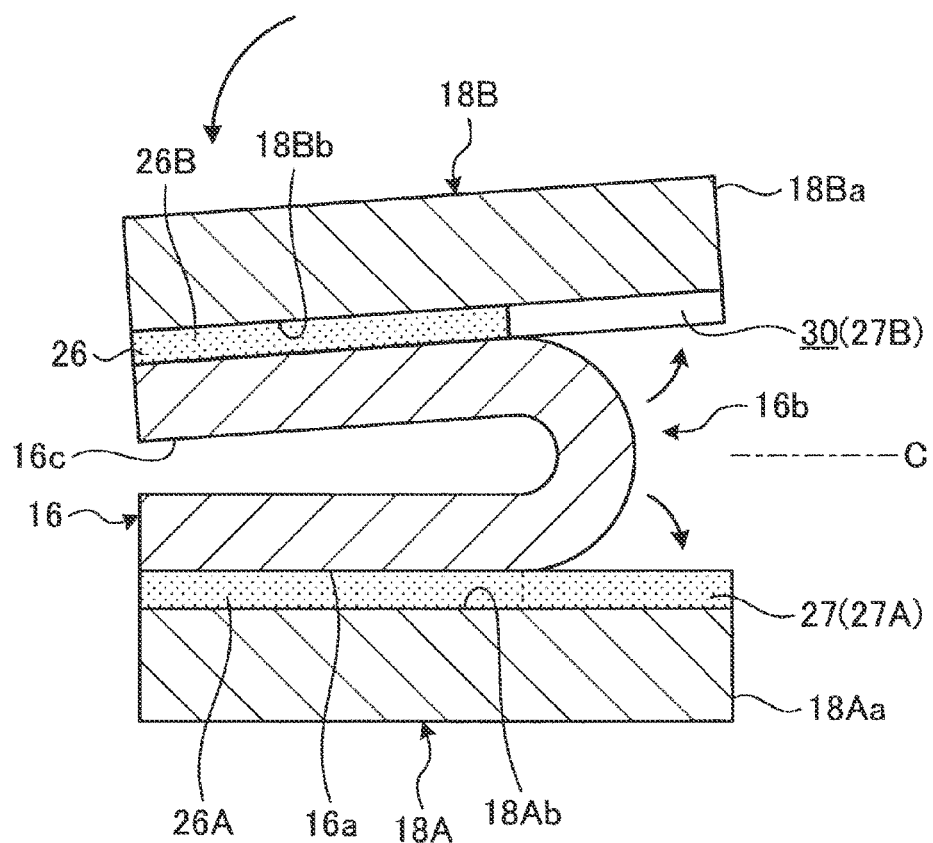
FIG. 5B is a cross-sectional side view schematically showing a configuration of the display, the adhesive member, and the support plates in the storage form.
Figure 6:
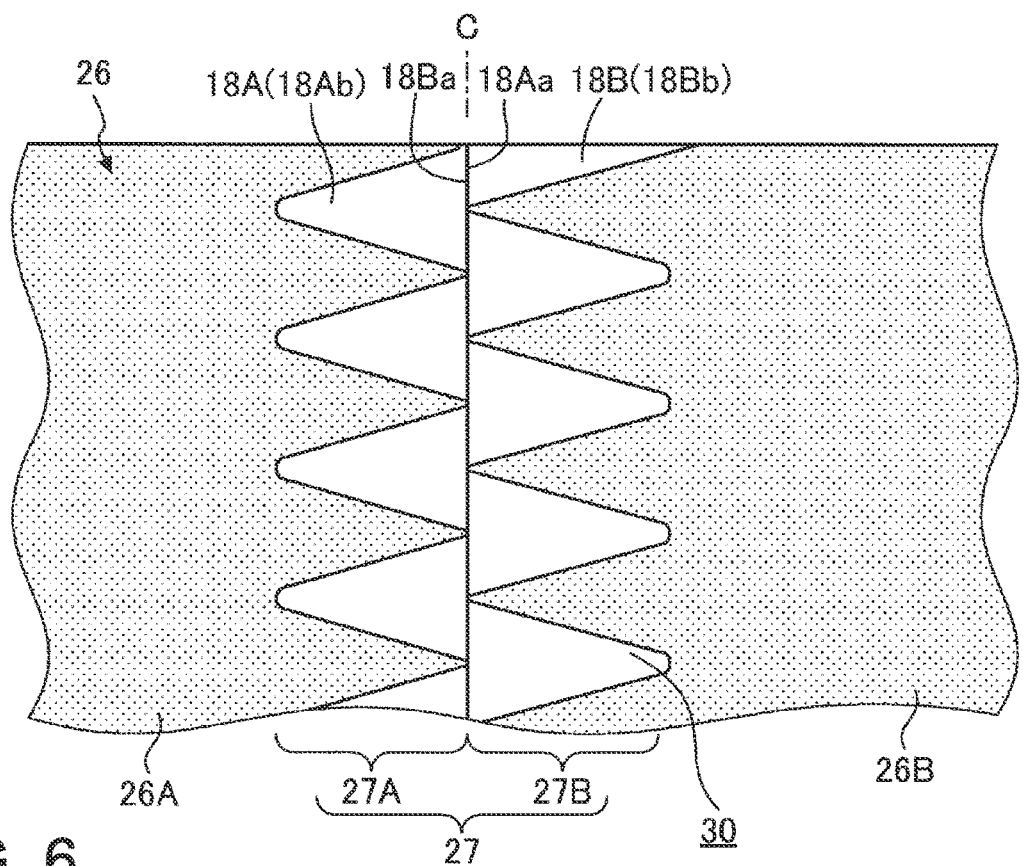
FIG. 6 is an enlarged plan view of a portion of the adhesive member provided on respective front surfaces of the support plates.
Figure 7:
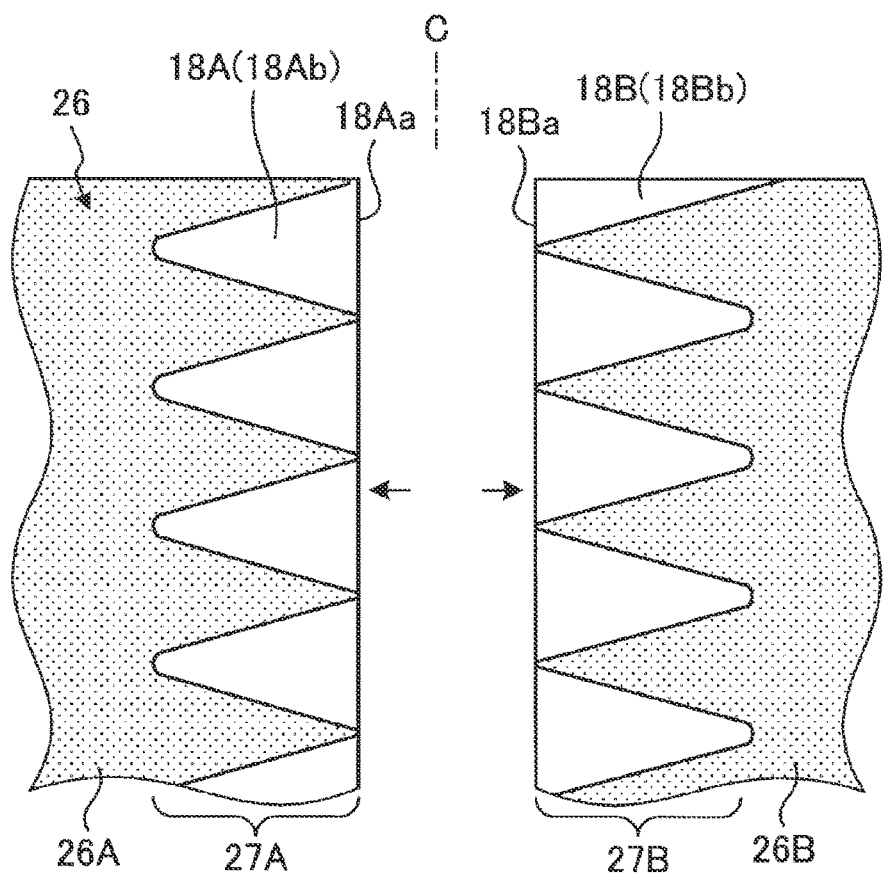
FIG. 7 is a plan view schematically showing a state where the support plates with the adhesive member provided on their front surfaces are in the middle of a folding motion from the operable form to the storage form.

Subsequently, a configuration example of the adhesive member 26 is described. FIG. 4 is a plan view of the adhesive member 26. FIG. 5A is a cross-sectional side view schematically showing a configuration of the display 16, the adhesive member 26, and the support plates 18A and 18B in the operable form. FIG. 5B is a cross-sectional side view schematically showing a configuration of the display 16, the adhesive member 26, and the support plates 18A and 18B in the storage form. FIG. 5A shows a state of the adhesive member 26 in section along a line VA-VA in FIG. 4. FIG. 6 is an enlarged plan view of a portion of the adhesive member 26 provided on the front surfaces 18Ab and 18Bb of the support plates 18A and 18B. FIG. 7 is a plan view schematically showing a state where the support plates 18A and 18B with the adhesive member 26 provided on their front surfaces 18Ab and 18Bb are in the middle of a folding motion from the operable form to the storage form. FIG. 7 planarly shows the motion of the support plates 18A and 18B being separated from each other in accordance with the folding motion of the chassis members 12A and 12B. The same holds true for FIG. 9 to be described later.

As shown in FIGS. 5A and 5B, the adhesive member 26 fastens the back surface 16a of the display 16 and the front surfaces 18Ab and 18Bb of the support plates 18A and 18B together. The adhesive member 26 is, for example, double-sided tape such as pressure sensitive adhesive (PSA) or optical clear adhesive (OCA). The adhesive member 26 has a thickness of, for example, about 10 μm to 30 μm. It is to be noted that the adhesive member here means a member that fastens two substances together. Besides double-sided tape formed into a tape, the concept of the adhesive member includes, for example, an adhesive that is applied in the same manner as double-sided tape.

As shown in FIGS. 4 and 6, the adhesive member 26 includes a first adhesive section 26A, a second adhesive section 26B, and a weak adhesive section 27.

The first adhesive section 26A adheres to the front surface 18Ab of the first support plate 18A and about half the area of the back surface 16a of the display 16, the area overlapping the front surface 18Ab, and fastens them together. The second adhesive section 26B adheres to the front surface 18Bb of the second support plate 18B and about half the area of the back surface 16a of the display 16, the area overlapping the front surface 18Bb, and fastens them together. The first adhesive section 26A and the second adhesive section 26B are provided on the left and right sides across the weak adhesive section 27.

The weak adhesive section 27 is provided so as to straddle the folding center C, and extends like a belt along the Y direction. The weak adhesive section 27 is a section having a lower adhesive force than the adhesive sections 26A and 26B. The weak adhesive section 27 is provided at least over an area that overlaps with a folding area 16b of the display 16. The weak adhesive section 27 may be provided over a slightly larger area than the folding area 16b. The folding area 16b is a portion of the display 16 that is curved into an arc-like shape when the chassis members 12A and 12B and the support plates 18A and 18B are folded (see FIG. 5B).

The weak adhesive section 27 includes a first area 27A adhering to the first support plate 18A and a second area 27B adhering to the second support plate 18B with reference to a boundary (the folding center C) between the support plates 18A and 18B. The first area 27A is integrally provided on an edge of the first adhesive section 26A on the side of the folding center C, and has a wavy shape extending along the folding center C. The second area 27B is integrally provided on an edge of the second adhesive section 26B on the side of the folding center C, and has a wavy shape extending along the folding center C. The wavy shapes of the areas 27A and 27B are shifted in phase, for example, by 0.5 periods and face each other through a gap 30 between them. The gap 30 is an area between the first area 27A and the second area 27B in which the adhesive member 26 is not provided. That is, the gap 30 may be rephrased as a non-adhesive portion 30 provided with no adhesive or the like that forms the adhesive member 26. The non-adhesive portion 30 divides the areas 27A and 27B on the left and right sides centering on the folding center C. The weak adhesive section 27 includes the non-adhesive portion 30, and thus is lower in adhesive force per unit area than the adhesive sections 26A and 26B. In other words, the adhesive sections 26A and 26B are not provided with the non-adhesive portion 30, and thus are higher in adhesive force per unit area than the weak adhesive section 27. To reduce use of the adhesive member 26, the adhesive sections 26A and 26B may have a non-adhesive portion in some degree; however, the percentage of the non-adhesive portion per unit area is lower than at least the weak adhesive section 27.

The weak adhesive section 27 can be easily formed, for example, by applying the adhesive member 26 onto the support plates 18A and 18B with masking tape (not shown) formed into the shape of the gap 30 put thereon and removing the masking tape to peel off a portion of the adhesive member 26 corresponding to the masking tape.

The back surface 16a of the display 16 in the present embodiment is provided with a covering film made of silicone. On the other hand, the support plates 18A and 18B, including their front surfaces 18Ab and 18Bb, are formed of a fiber-reinforced resin plate. Thus, the adhesive member 26 formed of, for example, the above-described PSA or OCA adheres more firmly to the support plates 18A and 18B than to the display 16. As a result, the weak adhesive section 27 having a lower adhesive force than the adhesive sections 26A and 26B adheres to the support plates 18A and 18B with sort of a high adhesive force. On the other hand, the weak adhesive section 27 adheres to the display 16 with a low adhesive force. Thus, in a case where the weak adhesive section 27 is subjected to a detachment force, the weak adhesive section 27 detaches itself from the display 16 prior to the support plates 18A and 18B. In this way, the adhesive force of the weak adhesive section 27 in the present embodiment on the back surface 16a of the display 16 is low relative to the adhesive force on the front surfaces 18Ab and 18Bb of the support plates 18A and 18B.

Subsequently, the folding motion of the portable information device 10 from the operable form to the storage form and the state of the adhesive member 26 during this motion are described.

When the portable information device 10 is in the operable form shown in FIG. 2, as shown in FIG. 5A, respective end surfaces of the first edges 18Aa and 18Ba are in contact with each other, and the support plates 18A and 18B form one plate. In this state, the adhesive sections 26A and 26B of the adhesive member 26 adhere to the support plates 18A and 18B and the display 16 over a large area. The weak adhesive section 27 of the adhesive member 26 adheres to a portion around the first edges 18Aa and 18Ba of the tabular support plates 18A and 18B and the folding area 16b of the display 16 that is opened and forms one plate. Thus, substantially the entire surface of the display 16 including the folding area 16b is securely fastened onto the support plates 18A and 18B, and this suppresses the occurrence of creases or uplift in the display 16 including the folding area 16b and its surrounding area. This secures the quality of external appearance and the visibility of the display 16 when the portable information device 10 is in the operable form.

Next, when the portable information device 10 is folded from the operable form to the storage form, as shown in FIG. 5B, the weak adhesive section 27 of the adhesive member 26 detaches itself from the back surface 16a of the display 16. That is, the adhesive member 26 is located on the outer side than the front surface 16c of the display 16 on which the central axis of turning of the hinge mechanisms 19 is located, and therefore is subjected to a pulling force caused by a turning radius difference when the display 16 is folded. Thus, the weak adhesive section 27 that is provided for the folding area 16b and has a lower adhesive force than the other section (the adhesive sections 26A and 26B) is subjected to a force to detach itself from the front surfaces 18Ab and 18Bb of the support plates 18A and 18B or the back surface 16a of the display 16. At this time, as described above, the adhesive force on the back surface 16a of the display 16 is low relative to the adhesive force on the front surfaces 18Ab and 18Bb of the support plates 18A and 18B. Therefore, the weak adhesive section 27 detaches itself from the display 16, and remains on the support plates 18A and 18B.

At the same time, the first edges 18Aa and 18Ba of the support plates 18A and 18B are separated from each other. As a result, in the storage form, the first adhesive section 26A and the first area 27A of the weak adhesive section 27 remains on the first support plate 18A, and the second adhesive section 26B and the second area 27B remains on the second support plate 18B (see FIGS. 5B and 7).

In this way, when the portable information device 10 is in the operable form, substantially the entire back surface 16a of the display 16 can be adhered and fastened to the adhesive member 26. Furthermore, the adhesive member 26 includes the weak adhesive section 27, and therefore, when the portable information device 10 is folded into the storage form, the weak adhesive section 27 detaches itself from the display 16. As a result, the display 16 can be smoothly folded into the storage form, and, further, is prevented from being subjected to an excessive load or a folding force of a curvature beyond a design condition when it is folded.

The weak adhesive section 27 may be configured to, for example, have a higher adhesive force around both ends in the Y direction than that of a middle portion in the Y direction. Then, it is possible to more certainly suppress the occurrence of creases, etc. in both Y-direction ends of the folding area 16b of the display 16 where creases or uplift is likely to be conspicuous.

Next, when the portable information device 10 is opened from the storage form to the operable form, as shown in FIG. 5A, the weak adhesive section 27 is pressed between the display 16 and the support plates 18A and 18B, and again adheres to the both. Thus, substantially the entire surface of the display 16 including the folding area 16b is again fastened onto the support plates 18A and 18B, and this suppresses the occurrence of creases or uplift in the display 16 including the folding area 16b and its surrounding area.

Figure 8:
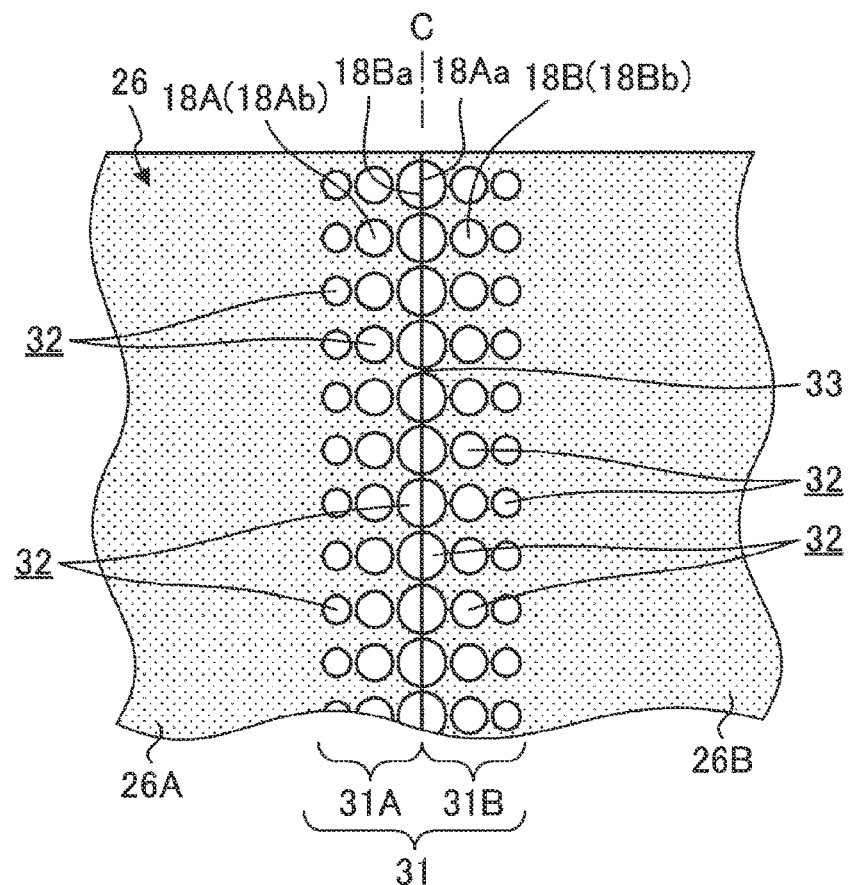
FIG. 8 is an enlarged plan view of a portion of the front surfaces of the support plates provided with the adhesive member including a weak adhesive section according to a first modification example.
Figure 9:
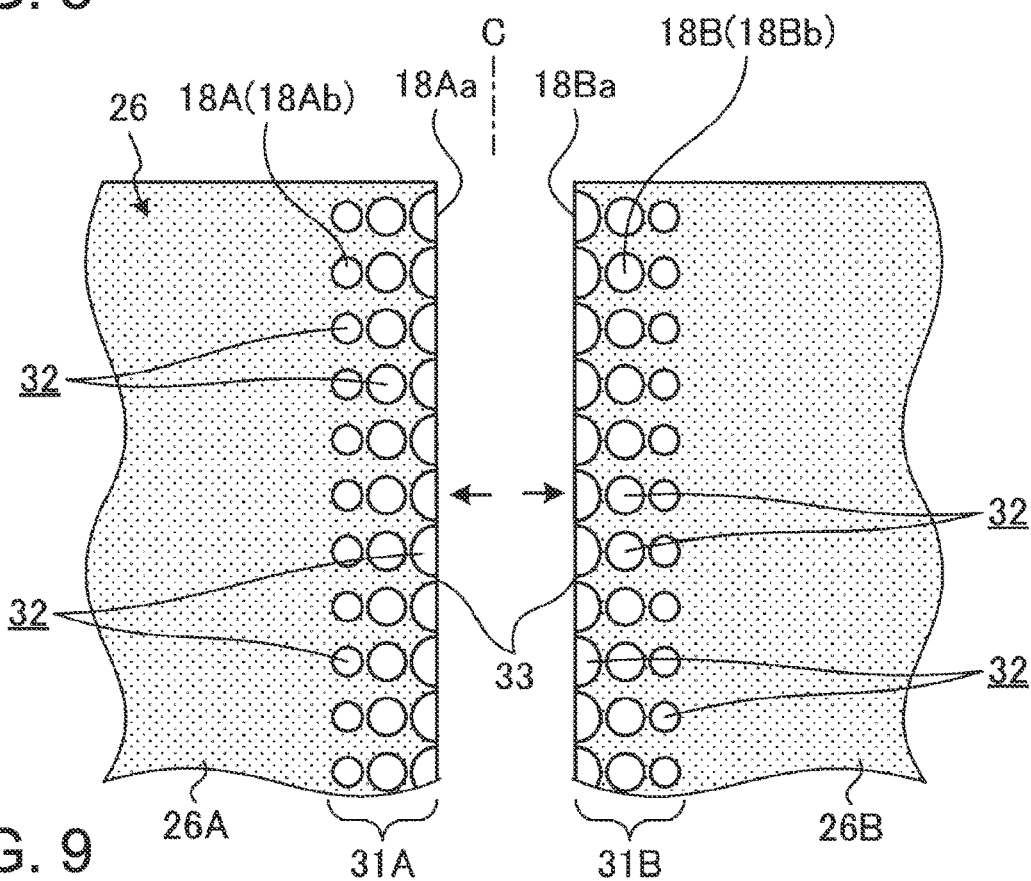
FIG. 9 is a plan view schematically showing a state where the support plates shown in FIG. 8 are in the middle of a folding motion from the operable form to the storage form.

FIG. 8 is an enlarged plan view of a portion of the front surfaces 18Ab and 18Bb of the support plates 18A and 18B provided with the adhesive member 26 including a weak adhesive section 31 according to a modification example. FIG. 9 is a plan view schematically showing a state where the support plates 18A and 18B shown in FIG. 8 are in the middle of a folding motion from the operable form to the storage form.

As shown in FIGS. 8 and 9, the weak adhesive section includes first and second areas 31A and 31B having different shapes from the first and second areas 27A and 27B of the weak adhesive section 27 described above. The areas 31A and 31B each have a plurality of holes 32 arranged along a position that overlaps with the folding area 16b of the display 16. The holes 32 are not provided with the adhesive member 26. That is, the holes 32 may be rephrased as circular non-adhesive portions 32 provided with no adhesive or the like that forms the adhesive member 26.

In a configuration example shown in FIGS. 8 and 9, the non-adhesive portions 32 have a bilaterally symmetric pattern with respect to the folding center C. Specifically, the non-adhesive portions 32 of the first area 31A have a configuration in which a plurality of sets of three circular holes is arranged in the Y direction; the three circular holes in each set are aligned in the X direction and their diameters increase toward to the folding center C. The non-adhesive portions 32 of the second area 31B have a configuration in which a plurality of sets of three circular holes is arranged in the Y direction; the three circular holes in each set are aligned in the X direction and their diameters increase toward to the folding center C. The non-adhesive portions 32 having the largest diameter that overlap with the folding center C are each divided in half in the X direction and used by the first area 31A and the second area 31B. These non-adhesive portions 32 having the largest diameter and arranged adjacent in the Y direction are each divided into right and left portions by a cut 33. That is, the cut 33 along the folding center C divides the first area 31A and the second area 31B.

The weak adhesive section 31 shown in FIGS. 8 and 9 includes the plurality of non-adhesive portions 32, and thus is lower in adhesive force per unit area than the adhesive sections 26A and 26B. Therefore, also in the configuration using the adhesive member 26 that includes this weak adhesive section 31, similar workings and effects to those of the configuration example shown in FIGS. 5A and 5B are obtained. That is, when the portable information device 10 is in the operable form shown in FIG. 8, substantially the entire surface of the display 16 is adhered to the support plates 18A and 18B through the weak adhesive section 31, and this suppresses the occurrence of creases or uplift. Furthermore, when the portable information device 10 is in the storage form shown in FIG. 9, the weak adhesive section 31 detaches itself from the back surface 16a of the display 16, and thus the chassis members 12A and 12B are smoothly folded. The shape of the holes 32 is not limited to a circular shape, and may be, for example, a polygonal shape, or the weak adhesive section 31 may be formed into a mesh pattern of a plurality of holes 32.

It is to be noted that the weak adhesive sections 27 and 31 in FIGS. 4 to 9 may be configured to detach themselves from the support plates 18A and 18B and remain on the display 16 when the chassis members 12A and 12B are folded. In this case, the material of the back surface 16a of the display 16 or the front surfaces 18Ab and 18Bb of the support plates 18A and 18B only has to be changed to a different material from the configuration example shown in FIGS. 5A and 5B. Furthermore, as long as the weak adhesive sections 27 and 31 can detach themselves from the display 16 or the support plates 18A and 18B when the chassis members 12A and 12B are folded, the respective shapes of the weak adhesive sections and 31 can be changed appropriately. That is, the amplitude and period of the wavy shape of the weak adhesive section 27 may be changed appropriately. Furthermore, the weak adhesive section 27 may be configured to have another shape other than the wavy shape, and the weak adhesive section 31 may be configured to have something other than the plurality of holes 32.

Figure 10:
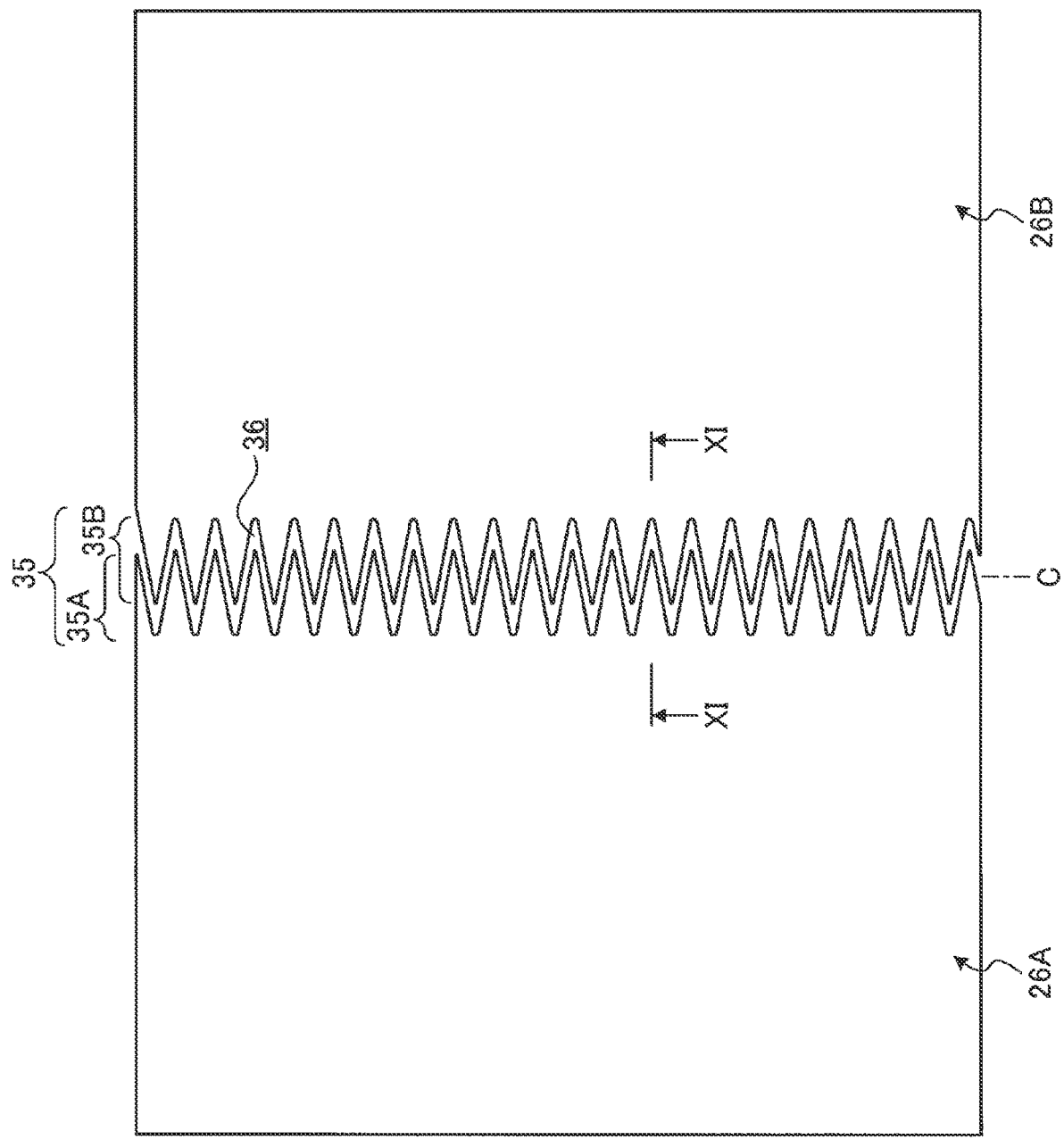
FIG. 10 a plan view of an adhesive member according to a modification example.
Figure 11A:
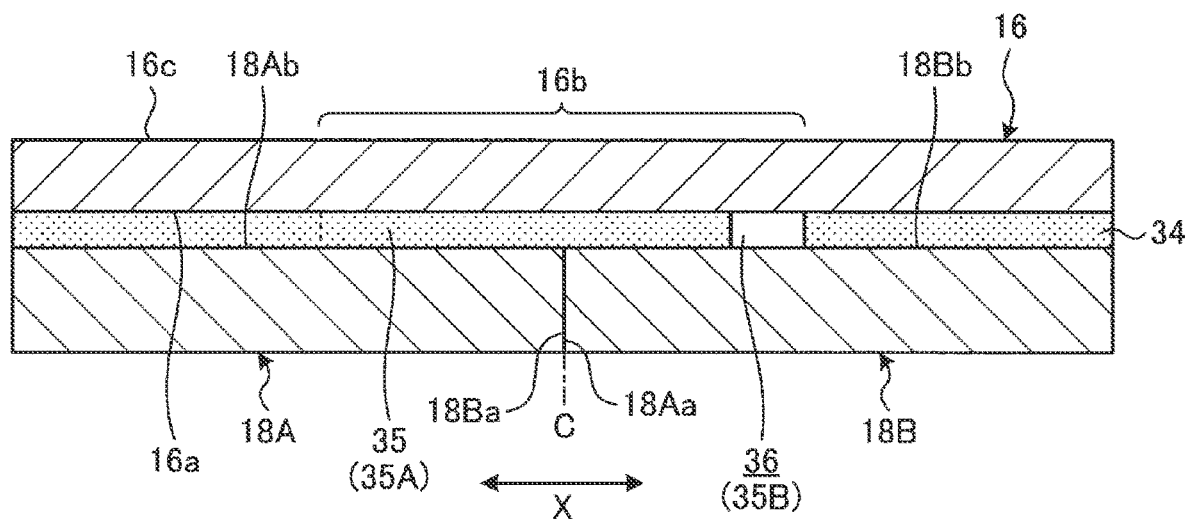
FIG. 11A is a cross-sectional side view schematically showing a configuration of the display, the adhesive member, and the support plates in the operable form in a configuration example shown in FIG. 10.
Figure 11B:
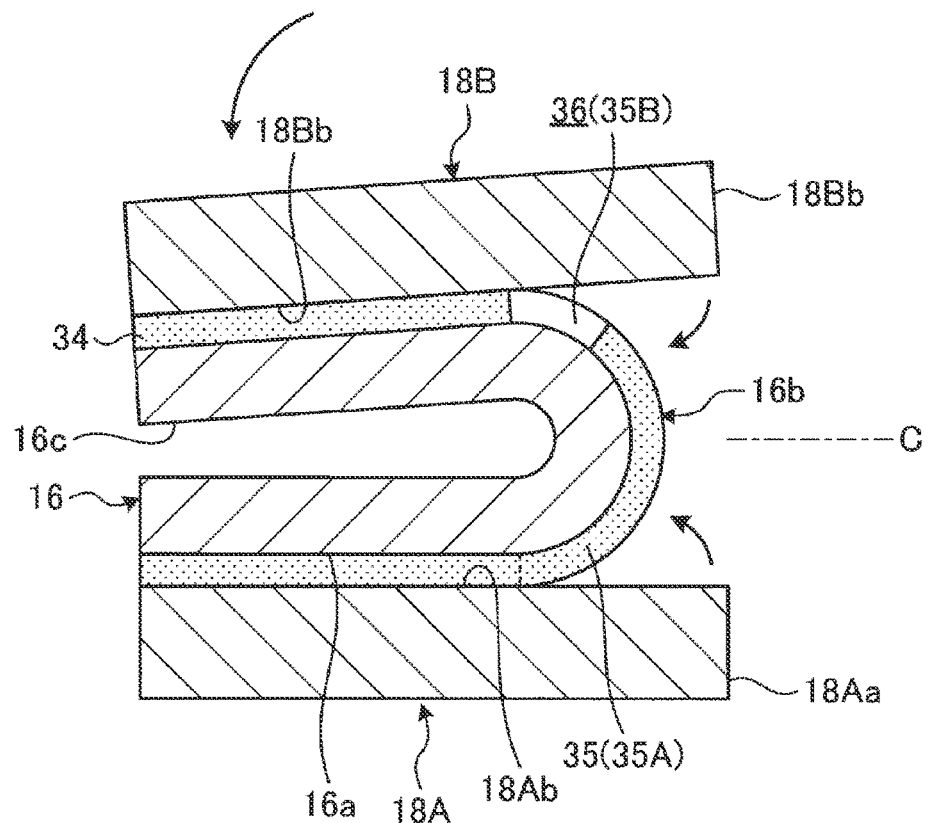
FIG. 11B is a cross-sectional side view schematically showing a configuration of the display, the adhesive member, and the support plates in the storage form in the configuration example shown in FIG. 10.
Figure 12:
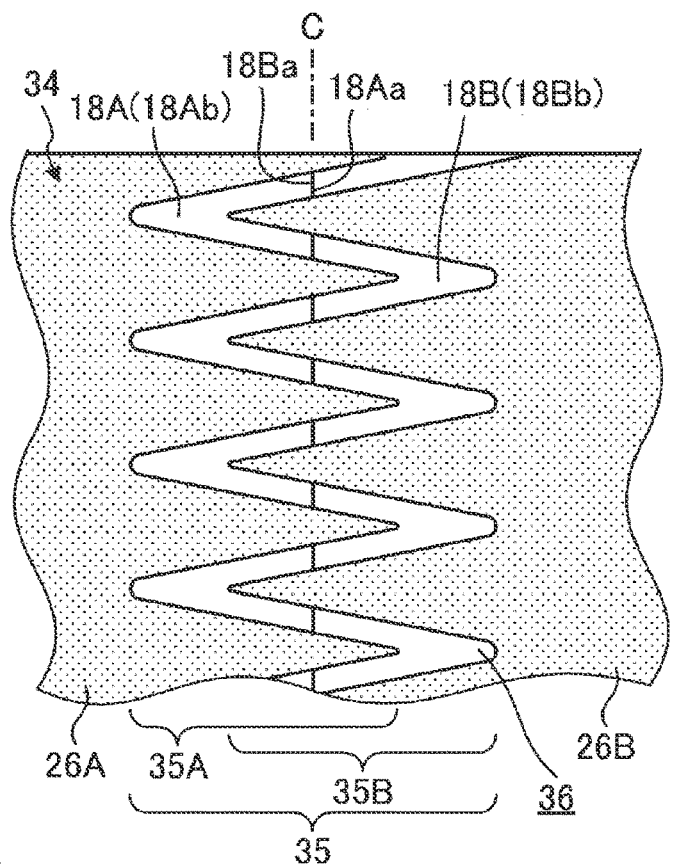
FIG. 12 is an enlarged plan view of a portion of the adhesive member provided on the front surfaces of the support plates in the configuration example shown in FIG. 10.

FIG. 10 a plan view of an adhesive member 34 according to a modification example. FIG. 11A is a cross-sectional side view schematically showing a configuration of the display 16, the adhesive member 34, and the support plates 18A and 18B in the operable form. FIG. 11B is a cross-sectional side view schematically showing a configuration of the display 16, the adhesive member 34, and the support plates 18A and 18B in the storage form. FIG. 11A shows a state of the adhesive member 34 in section along a line XI-XI in FIG. 10. FIG. 12 is an enlarged plan view of a portion of the adhesive member 34 provided on the front surfaces 18Ab and 18Bb of the support plates 18A and 18B.

As shown in FIGS. 10 to 12, the adhesive member 34 includes a weak adhesive section 35 having a different configuration from the weak adhesive section 27 of the adhesive member 26 described above. The material of the adhesive member 34 may be the same as the adhesive member 26. The weak adhesive section 35 includes a first area 35A and a second area 35B.

The first area 35A is integrally provided on the edge of the first adhesive section 26A on the side of the folding center C, and has a wavy shape extending along the folding center C. The second area 35B is integrally provided on the edge of the second adhesive section 26B on the side of the folding center C, and has a wavy shape extending along the folding center C. The teeth of the wavy shapes of the areas 35A and 35B are engaged with each other, and the wavy shapes face each other with a wavy gap 36 between them. The first area 35A juts out into the second support plate 18B side beyond the folding center C. The second area 35B juts out into the first support plate 18A side beyond the folding center C. The gap 36 is an area between the first area 35A and the second area 35B in which the adhesive member 34 is not provided. That is, the gap 36 may be rephrased as a non-adhesive portion 36 provided with no adhesive or the like that forms the adhesive member 34. The weak adhesive section 35 includes the non-adhesive portion 36, and thus is lower in adhesive force per unit area than the adhesive sections 26A and 26B.

In this configuration example, the material of the back surface 16a of the display 16 or the front surfaces 18Ab and 18Bb of the support plates 18A and 18B is different from the configuration example shown in FIGS. 5A and 5B. Thus, the adhesive member 34 adheres more firmly to the display 16 than to the support plates 18A and 18B (see FIGS. 11A and 11B). That is, the adhesive force of the weak adhesive section 35 on the front surfaces 18Ab and 18Bb of the support plates 18A and 18B is low relative to the adhesive force on the back surface 16a of the display 16.

When the portable information device 10 using the adhesive member 34 is in the operable form shown in FIG. 2, as shown in FIG. 11A, substantially the entire surface of the display 16 including the folding area 16b is securely fastened onto the support plates 18A and 18B. This suppresses the occurrence of creases or uplift in the display 16 including the folding area 16b and its surrounding area.

When the portable information device 10 using the adhesive member 34 is folded from the operable form to the storage form, as shown in FIG. 11B, the weak adhesive section 35 of the adhesive member 34 detaches itself from the front surfaces 18Ab and 18Bb of the support plates 18A and 18B. That is, the weak adhesive section 35 detaches itself from the support plates 18A and 18B, and is deformed into an arc-like shape while being subjected to a slight pulling force along back surface 16a of the folding area 16b of the display 16.

Therefore, also in this configuration example, when the portable information device 10 is in the operable form, substantially the entire back surface 16a of the display 16 can be adhered and fastened to the adhesive member 34. Furthermore, the adhesive member 34 includes the weak adhesive section 35, and therefore, the display 16 can be smoothly folded into the storage form, and thus is prevented from being subjected to an excessive load or following an out-of-design folding trajectory when folded. It is to be noted that in the adhesive member 34, the areas 35A and 35B of the weak adhesive section 35 are configured to jut out beyond the folding center C. Thus, although the weak adhesive section 35 cannot be divided into right and left portions by the folding center C as a boundary, the weak adhesive section 35 detaches itself from the support plates 18A and 18B and remain on the display 16 side when the chassis members 12A and 12B are folded. Therefore, even in the configuration using the adhesive member 34, the first edges 18Aa and 18Ba of the support plates 18A and 18B are separated from each other, and the display 16 can be smoothly folded into the storage form.

Figure 13:
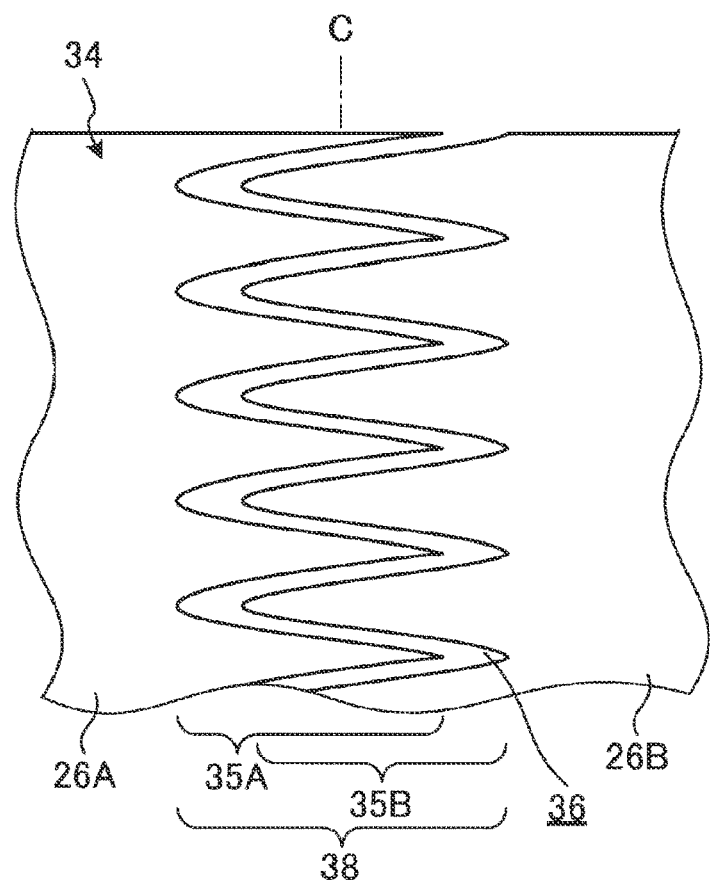
FIG. 13 is an enlarged plan view of a portion of the adhesive member shown in FIG. 10 that uses a weak adhesive section according to a modification example.
Figure 14:
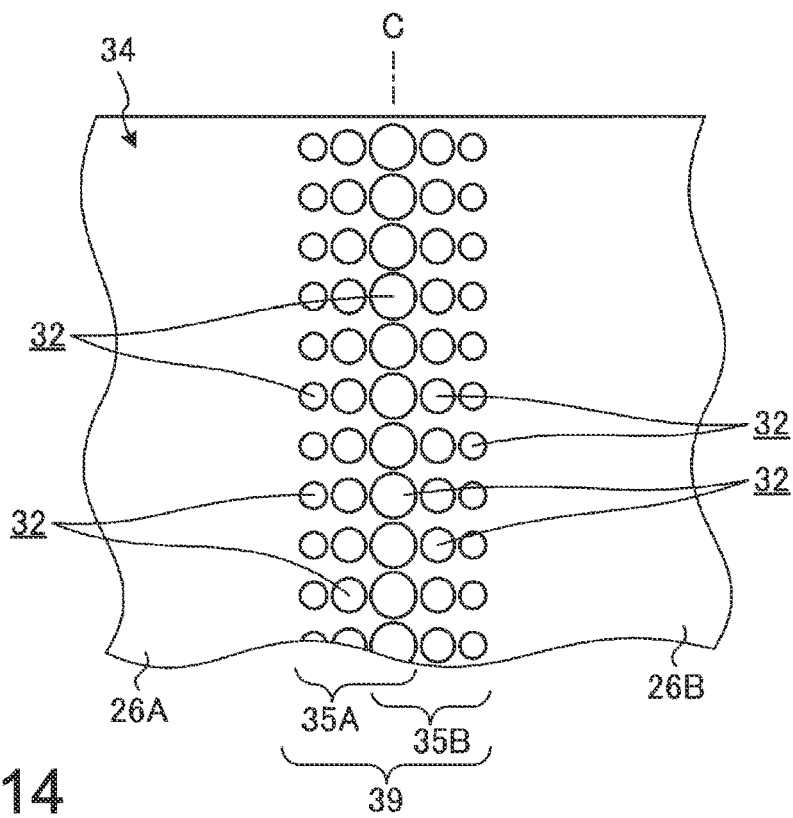
FIG. 14 is an enlarged plan view of a portion of the adhesive member shown in FIG. 10 that uses a weak adhesive section according to another modification example.

That is, unlike the above-described adhesive member 26, the adhesive member 34 does not have to be capable of being divided into right and left portions in accordance with separation of the support plates 18A and 18B. Accordingly, as long as the weak adhesive section 35 can detach itself from the support plates 18A and 18B when the chassis members 12A and 12B are folded, the shape of the weak adhesive section 35 can be changed appropriately. For example, the adhesive member 34 may use a weak adhesive section 38 shown in FIG. 13 instead of the weak adhesive section 35. The weak adhesive section 38 has a similar basic configuration to the weak adhesive section 35 shown in FIG. 12, except for respective wavy shapes of the areas 35A and 35B. The amplitude and period of each of the wavy shapes of the weak adhesive sections 35 and 38 may be changed appropriately. A weak adhesive section 39 shown in FIG. 14 has a configuration in which the cut 33 is omitted from the weak adhesive section 31 of the adhesive member 26 shown in FIG. 8. The shape, the installed number, the arrangement, etc. of holes (non-adhesive portions) 32 of the weak adhesive section 39 may be changed appropriately. Furthermore, besides the configuration having wavy shapes and the configuration having holes, the weak adhesive section may be formed into, for example, a mesh pattern.

It is to be noted that needless to say, the present invention is not limited to the above-described embodiment, and various modifications may be made without departing from the scope of the invention.

Figure 15:
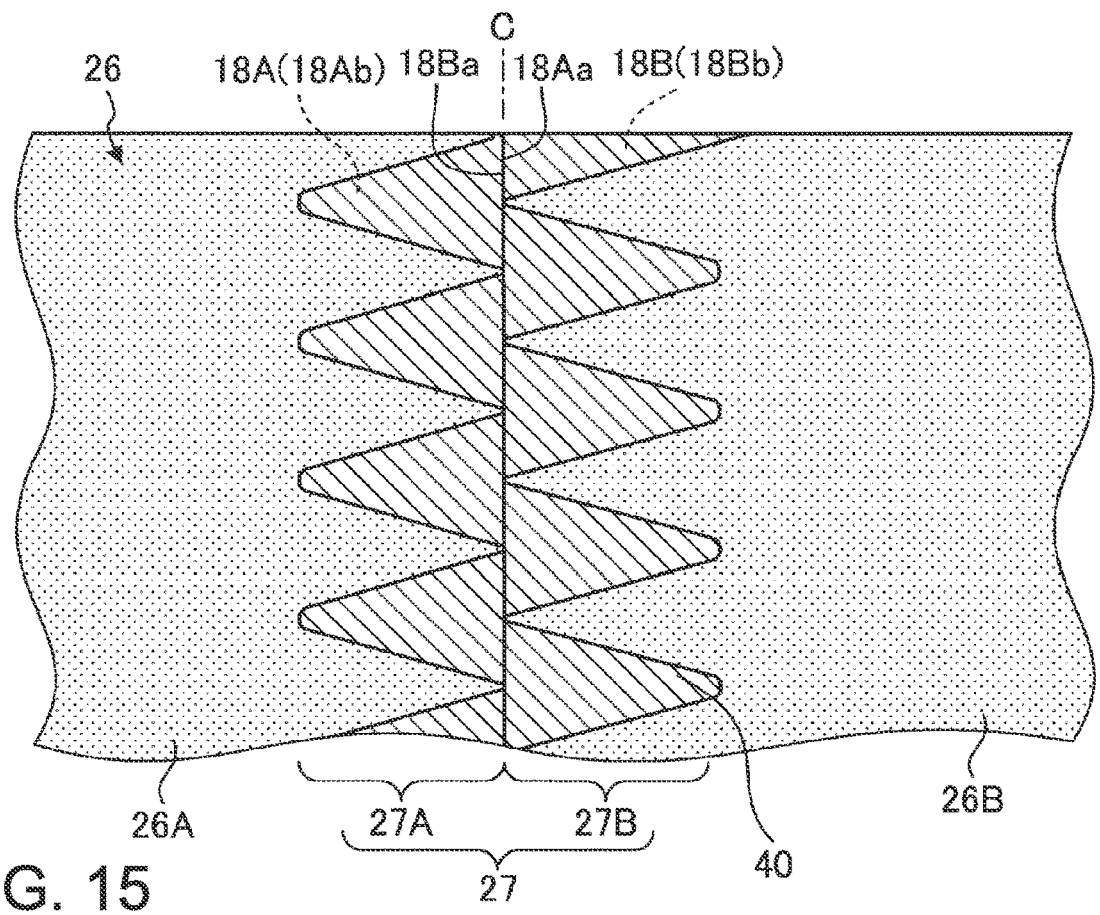
FIG. 15 is an enlarged plan view of a portion of the front surfaces of the support plates provided with the adhesive member including a weak adhesive section according to a second modification example.

In the above, there is described an example where a non-adhesive portion provided with no adhesive member 26 or 34 is provided as any weak adhesive section, such as the weak adhesive sections 27 and 35, and thereby its overall adhesive force is reduced to be lower than that of the other section. However, for example, the weak adhesive section 27 may be configured to be reduced in adhesive force in such a manner that, as shown in FIG. 15, a non-adhesive portion is formed by covering a portion of adhesive surfaces of the adhesive member 26 uniformly provided over the entire surfaces of the support plates 18A and 18B and the display 16 with a masking material 40 such as masking tape.

Figure 16:
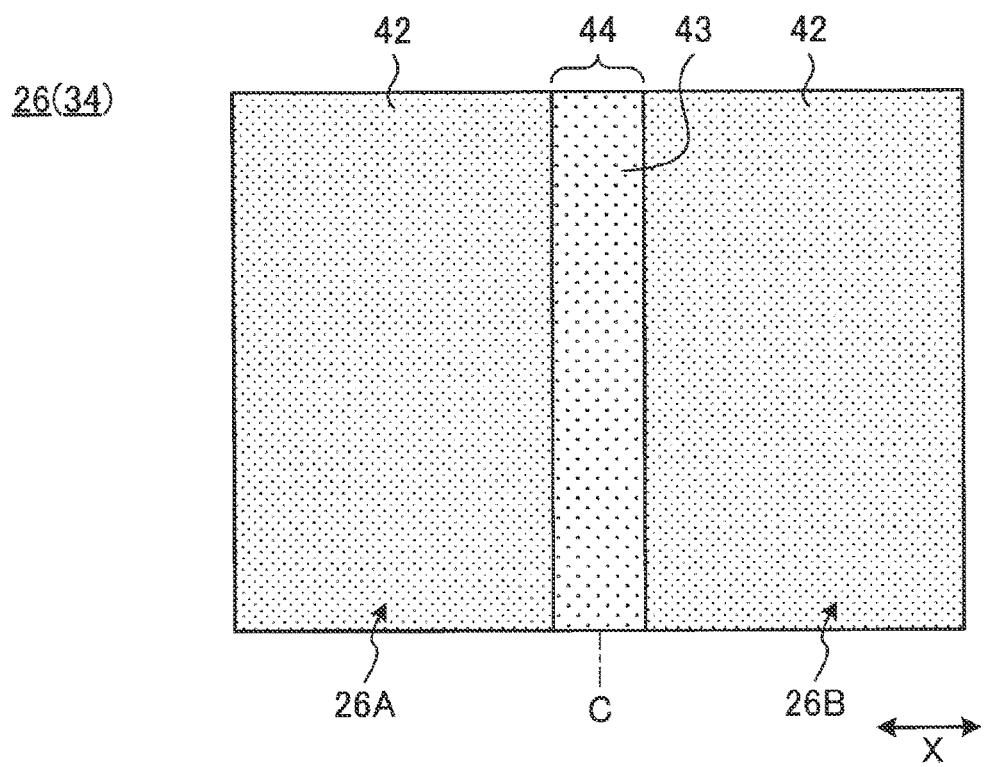
FIG. 16 is a plan view of the adhesive member including a weak adhesive section according to a third modification example.

Instead of the configuration using the non-adhesive portion 30, etc. or the configuration using the masking material 40, as shown in FIG. 16, a weak adhesive section 44 may be formed in such a manner that the adhesive member 26 or 34 uses an adhesive 43 having lower adhesiveness than an adhesive 42 that forms the adhesive sections 26A and 26B. Both adhesive surfaces of the weak adhesive section 44 may be formed of the adhesive 43; alternatively, only one surface may be formed of the adhesive 43, and the other surface may be formed of the adhesive 42. It is to be noted that in a case where the weak adhesive section 44 is used in the adhesive member 26 divided into right and left portions, a cut along the folding center C only has to be made in the weak adhesive section 44.

Figure 17:
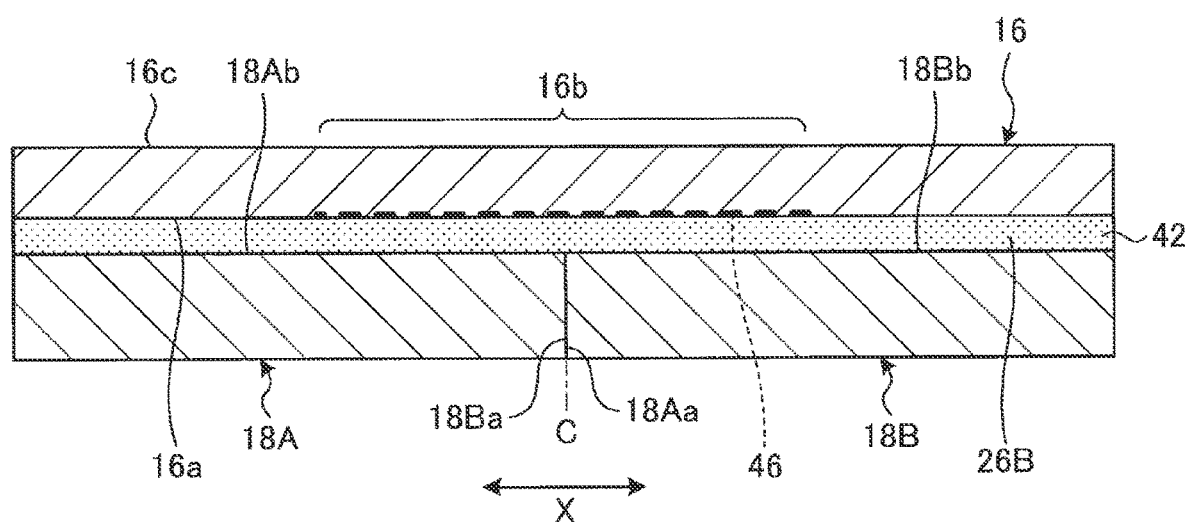
FIG. 17 is a plan view of the adhesive member including a weak adhesive section according to a fourth modification example.

As shown in FIG. 17, a weak adhesive section of the adhesive member 26 or 34 may be formed in such a manner that the adhesive sections 26A and 26B and a portion corresponding to the weak adhesive section in the above-described example are all uniformly formed of the adhesive 42, and a portion of the back surface 16a of the display 16 or the front surfaces 18Ab and 18Bb of the support plates 18A and 18B, the portion corresponding to the folding area 16b, is subjected to surface treatment 46 such as coating that reduces the adhesive force to the adhesive member 26 or 34. FIG. 17 shows an example of a configuration in which the back surface 16a of the display 16 is subjected to the surface treatment 46; however, the surface treatment 46 may be performed on the front surfaces 18Ab and 18Bb of the support plates 18A and 18B instead of the back surface 16a or together with the back surface 16a. Accordingly, in the configuration example shown in FIG. 17, the surface treatment 46 is performed on an area that overlaps with the folding area 16b, and thereby a weak adhesive section in which the adhesive force of the adhesive member (the adhesive 42) on the display 16 or the support plates 18A and 18B is reduced relative to a portion other than the folding area 16b is formed.

In the above, there is described the portable information device 10 that can be folded in two like a book; however, the present invention can be applied to various configurations other than the configuration in which chassis members having the same shape are folded in two, for example, a French-door configuration in which small chassis members are foldably connected to right and left edges of a large chassis member, an S-type folding configuration in which chassis members that differ in folding direction from each other are connected to right and left edges of one chassis member, a J-type folding configuration in which a small chassis member is foldably connected to either one of right and left edges of a large chassis member, etc., and the number of chassis members connected may be four or more.

The invention claimed is:

1. A portable information device comprising:
a first chassis member;

a second chassis member foldably connected to the first chassis member;
a first support plate fastened to the first chassis member;
a second support plate fastened to the second chassis member and located adjacent to the first support plate;
a display having a back surface supported by respective front surfaces of the first support plate and the second support plate, the display including a folding area that is folded when the first chassis member and the second chassis member are folded towards one another; and
an adhesive member that adheres to the respective front surfaces of the first support plate and the second support plate and to the back surface of the display, and fastens the first support plate and the second support plate and the display together,
wherein an area of the adhesive member that overlaps with at least the folding area includes a less adhesive section in which an adhesive force of the adhesive member with the respective front surfaces of the first support plate and the second support plate, and with the back surface of the display, is lower than another section of the adhesive member;
wherein the adhesive force in the less adhesive section is provided by an adhesive surface of the adhesive member having a non-adhesive portion covered with a masking material that removes an adhesive force from the non-adhesive portion.

2. The portable information device according to claim 1, wherein the non-adhesive portion has no adhesive applied thereto.

3. The portable information device according to claim 2, wherein
the less adhesive section includes a first area adhering to a side of the first support plate and a second area adhering to a side of the second support plate with reference to a boundary between the first support plate and the second support plate,
the first area has a wavy shape extending along the boundary,
the second area has a wavy shape that extends along the boundary and faces the wavy shape of the first area through a gap, and
the gap is the non-adhesive portion.

4. The portable information device according to claim 2, wherein
the less adhesive section includes a first area adhering to a side of the first support plate and a second area adhering to a side of the second support plate with reference to a boundary between the first support plate and the second support plate,
the first area and the second area each have a plurality of holes with no adhesive applied thereto, and
the holes are the non-adhesive portion.

5. The portable information device according to claim 1, wherein, in the less adhesive section, the adhesive force on both ends of the folding area in a longitudinal direction is higher than the adhesive force on a middle part of the folding area in the longitudinal direction.

6. A portable information device comprising:
a first chassis member;
a second chassis member foldably connected to the first chassis member;
a first support plate fastened to the first chassis member;
a second support plate fastened to the second chassis member and located adjacent to the first support plate;
a display having a back surface supported by respective front surfaces of the first support plate and the second support plate, the display including a folding area that is folded when the first chassis member and the second chassis member are folded towards one another; and
an adhesive member that adheres to the respective front surfaces of the first support plate and the second support plate and to the back surface of the display, and fastens the first support plate and the second support plate and the display together,
wherein an area of the adhesive member that overlaps with at least the folding area includes a less adhesive section in which an adhesive force of the adhesive member with the respective front surfaces of the first support plate and the second support plate, and with the back surface of the display, is lower than another section of the adhesive member;
wherein the adhesive force in the less adhesive section is provided by an adhesive having lower adhesiveness than the another section.

7. A portable information device comprising:
a first chassis member;
a second chassis member foldably connected to the first chassis member;
a first support plate fastened to the first chassis member;
a second support plate fastened to the second chassis member and located adjacent to the first support plate;
a display having a back surface supported by respective front surfaces of the first support plate and the second support plate, the display including a folding area that is folded when the first chassis member and the second chassis member are folded towards one another; and
an adhesive member that adheres to the respective front surfaces of the first support plate and the second support plate and to the back surface of the display, and fastens the first support plate and the second support plate and the display together,
wherein an area of the adhesive member that overlaps with at least the folding area includes a less adhesive section in which an adhesive force of the adhesive member with the respective front surfaces of the first support plate and the second support plate, and with the back surface of the display, is lower than another section of the adhesive member;
wherein, in the less adhesive section, an adhesive force of the adhesive member is provided by causing a portion of, at least either of the respective front surfaces of the first support plate and the second support plate and the back surface of the display, to be subjected to surface treatment.

8. A portable information device comprising:
a first chassis member;
a second chassis member foldably connected to the first chassis member;
a first support plate fastened to the first chassis member;
a second support plate fastened to the second chassis member and located adjacent to the first support plate;
a display having a back surface supported by respective front surfaces of the first support plate and the second support plate, the display including a folding area that is folded when the first chassis member and the second chassis member are folded towards one another; and
an adhesive member that adheres to the respective front surfaces of the first support plate and the second support plate and to the back surface of the display, and fastens the first support plate and the second support plate and the display together,
wherein an area of the adhesive member that overlaps with at least the folding area includes a less adhesive section in which an adhesive force of the adhesive member with the respective front surfaces of the first support plate and the second support plate, and with the back surface of the display, is lower than another section of the adhesive member;

wherein, in the less adhesive section, the adhesive force of the adhesive member on one of the back surface of the display and the respective front surfaces of the first support plate and the second support plate, is lower than an adhesive force of the adhesive member on another one of the back surface and respective front surfaces.

9. The portable information device according to claim 8, wherein when the first chassis member and the second chassis member are in an operable form, in which the first chassis member and the second chassis member are disposed on substantially a same plane, the less adhesive section adheres to the one surface and to the another surface, and when the first chassis member and the second chassis member are folded to a position in which the first chassis member and the second chassis member face each other, and are in a storage form in which the folding area is folded, the less adhesive section detaches itself from the one surface and adheres to the another surface.

10. The portable information device according to claim 9, wherein the one surface is the back surface of the display, the another surface is the respective front surfaces of the first support plate and the second support plate, and the less adhesive section includes a first area adhering to a side of the first support plate and a second area adhering to a side of the second support plate with reference to a boundary between the first support plate and the second support plate.

11. The portable information device according to claim 9, wherein the one surface is the respective front surfaces of the first support plate and the second support plate, the another surface is the back surface of the display, and the less adhesive section includes a first area adhering to from a side of the first support plate to a side of the second support plate and a second area adhering to from the side of the second support plate to the side of the first support plate with reference to a boundary between the first support plate and the second support plate.

* * * * *